US012562722B2

(12) United States Patent
Lakshman et al.

(10) Patent No.: US 12,562,722 B2
(45) Date of Patent: Feb. 24, 2026

(54) METHODS OF BALANCING CLOCK SKEW IN STACKED SEMICONDUCTOR DEVICES

(71) Applicant: Advanced Micro Devices, Inc., Santa Clara, CA (US)

(72) Inventors: Shravan Lakshman, Austin, TX (US); Sudarshan Selvarajan, Austin, TX (US); Russell Schreiber, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 19 days.

(21) Appl. No.: 18/395,226

(22) Filed: Dec. 22, 2023

(65) Prior Publication Data

US 2025/0211215 A1 Jun. 26, 2025

(51) Int. Cl.
| | |
|---|---|
| *H03K 5/00* | (2006.01) |
| *H01L 23/00* | (2006.01) |
| *H03K 3/037* | (2006.01) |
| *H03K 5/04* | (2006.01) |
| *H03K 17/56* | (2006.01) |

(52) U.S. Cl.
CPC .............. *H03K 5/04* (2013.01); *H01L 24/08* (2013.01); *H01L 24/80* (2013.01); *H03K 3/037* (2013.01); *H03K 17/56* (2013.01); *H01L 2224/08146* (2013.01); *H01L 2224/80895* (2013.01); *H01L 2224/80896* (2013.01)

(58) Field of Classification Search
CPC ........... H03K 5/04; H03K 5/12; H03K 5/003; H03K 5/1511; H03K 5/05; H03K 5/06; H03K 5/065; H03K 5/07; G06F 30/394; G06F 30/347; G06F 2119/06; G06F 1/10; G06F 10/12; G06F 1/14
See application file for complete search history.

(56) References Cited

U.S. PATENT DOCUMENTS

| | | | | |
|---|---|---|---|---|
| 9,030,253 B1* | 5/2015 | Ngai | .................... | H01L 25/0655 327/594 |
| 9,432,298 B1* | 8/2016 | Smith | ................. | H04L 49/9057 |
| 2013/0249612 A1* | 9/2013 | Zerbe | .................... | H04L 7/0079 327/161 |
| 2016/0013799 A1* | 1/2016 | Li | ........................ | H01L 25/0657 327/158 |
| 2020/0105732 A1* | 4/2020 | Chandrasekar | .. | H03K 19/17796 |
| 2020/0143853 A1* | 5/2020 | Navaratnam | ........ | G11C 7/1084 |
| 2022/0138387 A1* | 5/2022 | Narayanun | ........... | G06F 30/394 716/103 |
| 2022/0343045 A1* | 10/2022 | Herberholz | .......... | H03K 5/1504 |

* cited by examiner

*Primary Examiner* — Tuan T Lam
(74) *Attorney, Agent, or Firm* — Greenberg Traurig, LLP

(57) ABSTRACT

Methods of fabricating a semiconductor device include securing a first die to a second die. The first die includes a first clock signal path from a clock source to a first load and passing through a tap point electrically connected to a clock output. The second die includes a second clock signal path from a clock input to a second load. The methods also include connecting the clock input of the second die to the clock output of the first die. A first divergence between the tap point and the first load is substantially the same as a second divergence from the tap point through the clock input and the clock output to the second load. Various other methods, devices, and systems are also disclosed.

20 Claims, 6 Drawing Sheets

100

500

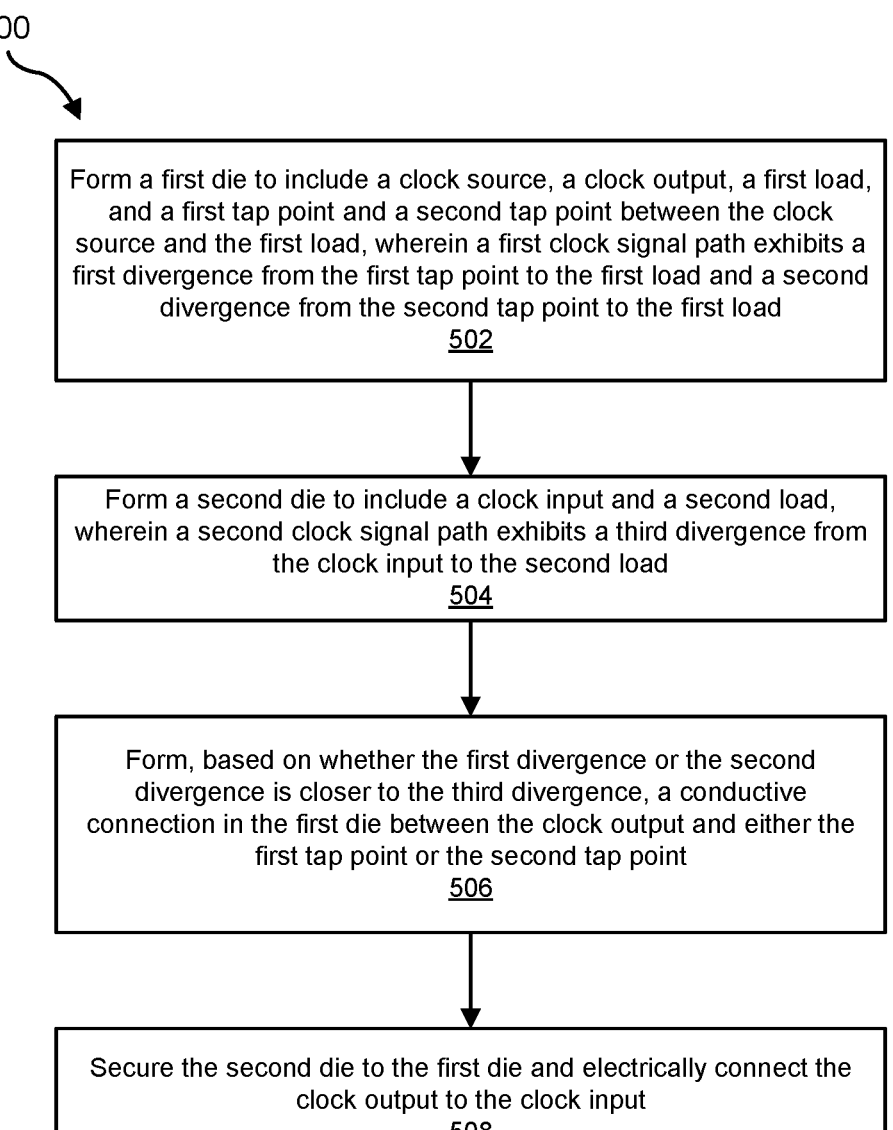

Form a first die to include a clock source, a clock output, a first load, and a first tap point and a second tap point between the clock source and the first load, wherein a first clock signal path exhibits a first divergence from the first tap point to the first load and a second divergence from the second tap point to the first load
502

Form a second die to include a clock input and a second load, wherein a second clock signal path exhibits a third divergence from the clock input to the second load
504

Form, based on whether the first divergence or the second divergence is closer to the third divergence, a conductive connection in the first die between the clock output and either the first tap point or the second tap point
506

Secure the second die to the first die and electrically connect the clock output to the clock input
508

Secure a first die to a second die, the first die including a first clock signal path from a clock source to a first load and passing through a tap point electrically connected to a clock output, the second die including a second clock signal path from a clock input to a second load

602

Electrically connect the clock input of the second die to the clock output of the first die, wherein a first divergence from the tap point to the first load is substantially the same as a second divergence from the tap point through the clock input and the clock output to the second load

METHODS OF BALANCING CLOCK SKEW IN STACKED SEMICONDUCTOR DEVICES

BACKGROUND

Computer processors are integrated circuits that execute instructions and perform computing tasks. To conserve space, reduce power consumption, and/or improve processing speed, some processors include two stacked logic dies that are assembled to communicate with each other. The stacked logic dies perform computing tasks together or separately.

At a basic level, operation of a computer processor includes transmitting, storing, and recalling data on a bit-by-bit basis. Some modern processors can perform up to billions of these operations every second, or at speeds of one or more gigahertz. Clock signals are electrical pulses that are often used by processors to indicate when the components of the processor are to perform the operations for proper synchronization and timing.

BRIEF DESCRIPTION OF THE DRAWINGS

The accompanying drawings illustrate a number of example implementations and are a part of the specification. Together with the following description, these drawings demonstrate and explain various principles of the present disclosure.

FIG. 5 is a flow diagram illustrating a method of fabricating a semiconductor device, according to one or more implementations of the present disclosure.

FIG. 6 is a flow diagram illustrating a method of fabricating a semiconductor device, according to one or more additional implementations of the present disclosure.

Figure 1:
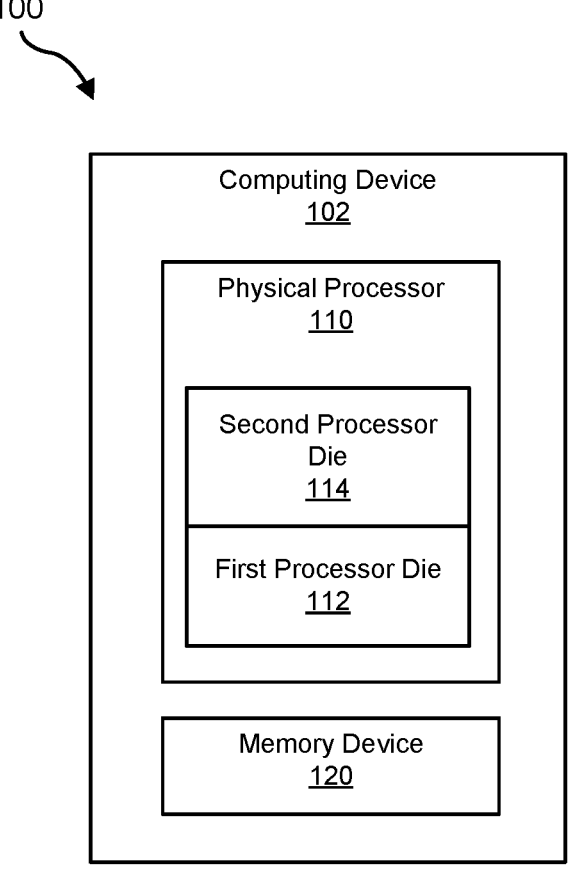
FIG. 1 is a diagram of a system including a computing device with stacked logic dies, according to at least one example implementation of the present disclosure.

Throughout the drawings, identical reference characters and descriptions indicate similar, but not necessarily identical, elements. While the examples described herein are susceptible to various modifications and alternative forms, specific implementations have been shown by way of example in the drawings and will be described in detail herein. However, the example implementations described herein are not intended to be limited to the particular forms disclosed. Rather, the present disclosure covers all modifications, equivalents, and alternatives falling within the scope of the appended claims.

DETAILED DESCRIPTION OF EXAMPLE IMPLEMENTATIONS

The present disclosure is generally directed to semiconductor devices, computer systems, and methods that employ a first die and a second die (e.g., processor dies, logic dies, etc.) in a stack. The dies each include a load to be at least partially activated by a clock signal. A first die in the stack has a clock source that generates the clock signal for use by a first load of the first die and a second load of the second die. Because the clock signal passes through two different paths to reach the load of the first die compared to the load of the second die, clock skew can be a concern.

Clock skew occurs when the clock signal from the clock source reaches different active components (e.g., the loads, such as state storage elements) at different times, resulting in activation of these components at different times. Clock skew can occur due to divergence when the clock signal reaches one component after passing through a small number of stages and another component after passing through a larger number of stages, resulting in an effectively longer pathway with potentially additional resistance and/or impedance. Clock skew can result in challenges in setup and hold operations of the semiconductor dies, which can cause performance problems (e.g., delayed or slowed operation) or require mitigation techniques (e.g., installation of buffers, etc.) to address.

Selecting a position of the tap point to substantially match a first divergence between the tap point and the first load of the first die with a second divergence between the tap point and the second load of the second die can inhibit (e.g., reduce, minimize, or eliminate) clock skew between the two dies. In other words, by substantially matching the two divergences in this manner, potential clock skew between the first die and the second die can be reduced or eliminated.

The following will provide, with reference to FIGS. 1-4, detailed descriptions of example semiconductor devices and computer systems including semiconductor devices according to various examples of the present disclosure. Detailed descriptions of methods of fabricating a semiconductor device will also be provided in connection with FIGS. 5 and 6.

In some aspects, the techniques described herein relate to a semiconductor device, including: a first die including a first clock signal path from a clock source to a first load and passing through a tap point, wherein the tap point is electrically connected to a clock output; and a second die secured to the first die, the second die including a second clock signal path from a clock input to a second load, the clock input electrically connected to the clock output, wherein: a first divergence from the tap point to the first load is substantially the same as a second divergence from the tap point to the second load.

In some aspects, the techniques described herein relate to a semiconductor device, wherein the first clock signal path includes one or more first gain stages and the second clock path includes one or more second gain stages.

In some aspects, the techniques described herein relate to a semiconductor device, wherein the tap point is between the one or more first gain stages and the one or more second gain stages.

In some aspects, the techniques described herein relate to a semiconductor device, wherein the second die is stacked over the first die such that a first major surface of the first die is secured to a second major surface of the second die.

In some aspects, the techniques described herein relate to a semiconductor device, wherein the clock input is electrically connected to the clock output through at least one of a conductive via and at least one of a conductive bond pad.

In some aspects, the techniques described herein relate to a semiconductor device, wherein: the first load includes a first flip-flop array; and the second load includes a second flip-flop array.

In some aspects, the techniques described herein relate to a semiconductor device, wherein the second semiconductor die further includes a local clock source for testing of the second die separate from the first die.

In some aspects, the techniques described herein relate to a semiconductor device, including: a first die including a clock source, a clock output, a first load, and a first tap point and a second tap point between the clock source and the first load, wherein a first clock signal path exhibits a first divergence from the first tap point to the first load and a second divergence from the second tap point to the first load; a second die including a clock input and a second load, wherein a second clock signal path from the first tap point to the second load and from the second tap point to the second load exhibits a third divergence; and a conductive connection in the first die between the clock output and either the first tap point or the second tap point based on whether the first divergence or the second divergence is closer to the third divergence, wherein the second die is secured to the first die and the clock output is electrically connected to the clock input.

In some aspects, the techniques described herein relate to a semiconductor device, wherein the first die includes at least one gain stage between the first tap point and the second tap point.

In some aspects, the techniques described herein relate to a semiconductor device, wherein the clock output is electrically connected to the clock input via to a conductive bond pad.

In some aspects, the techniques described herein relate to a semiconductor device, wherein: the first die includes a conductive via; the second die includes the conductive bond pad; and the conductive via of the first die is electrically connected to the conductive bond pad of the second die.

In some aspects, the techniques described herein relate to a semiconductor device, wherein the second die further includes a local clock source for testing of the second die separate from the first die.

In some aspects, the techniques described herein relate to a semiconductor device, wherein the local clock source includes a programmable driver connected to an output of the local clock source.

In some aspects, the techniques described herein relate to a semiconductor device, wherein: the first load of the first die includes a first flip-flop array; and the second load of the second die includes a second flip-flop array.

In some aspects, the techniques described herein relate to a semiconductor device, wherein the clock source of the first die includes at least one of: a phase-locked loop circuit, a frequency-locked loop circuit, or a delay-locked loop circuit.

In some aspects, the techniques described herein relate to a semiconductor device, wherein: the clock output of the first die includes at least two conductive vias in the first die; and the clock input of the second die includes at least two conductive bond pads in the second die.

In some aspects, the techniques described herein relate to a method of fabricating a semiconductor device, the method including: securing a first die, the first die including a first clock signal path from a clock source to a first load and passing through a tap point, wherein the tap point is electrically connected to a clock output of the first die, to a second die, the second die including second clock signal path from a clock input to a second load; and electrically connecting the clock input of the second die to the clock output of the first die, wherein a first divergence from the tap point to the first load is substantially the same as a second divergence from the tap point through the clock input and the clock output to the second load.

In some aspects, the techniques described herein relate to a method, wherein securing the first die to the second die includes securing a first major surface of the first die to a second major surface of the second die.

In some aspects, the techniques described herein relate to a method, further including selecting a position of the tap point along the first clock signal path to substantially match the first divergence with the second divergence.

In some aspects, the techniques described herein relate to a method, further including forming a conductive connection in the first die from the tap point to the clock output to electrically connect the tap point to the clock output.

In some aspects, the techniques described herein relate to a method, wherein the first clock signal path further includes at least a first gain stage and a second gain stage between the clock source and the first load.

In some aspects, the techniques described herein relate to a method, wherein the tap point is between the first gain stage and the second gain stage.

In some aspects, the techniques described herein relate to a method, wherein the second clock signal path further includes one or more gain stages between the clock input and the second load.

In some aspects, the techniques described herein relate to a method, further including driving operation of the second load of the second die with a clock signal from the clock source of the first die.

In some aspects, the techniques described herein relate to a method, wherein electrically connecting the clock input of the second die to the clock output of the first die includes electrically connecting at least one conductive bond pad to at least one conductive via.

In some aspects, the techniques described herein relate to a method of fabricating a semiconductor device, the method including: forming a first die to include a clock source, a clock output, a first load, and a first tap point and a second tap point between the clock source and the first load, wherein a first clock signal path exhibits a first divergence from the first tap point to the first load and a second divergence from the second tap point to the first load; forming a second die to include a clock input and a second load, wherein a second clock signal path from the first tap point to the second load and from the second tap point to the second load exhibits a third divergence; forming, based on whether the first divergence or the second divergence is closer to the third divergence, a conductive connection in the first die between the clock output and either the first tap point or the second tap point; and securing the second die to the first die and electrically connecting the clock output to the clock input.

In some aspects, the techniques described herein relate to a method, wherein the first die includes at least one gain stage between the first tap point and the second tap point.

In some aspects, the techniques described herein relate to a method, wherein electrically connecting the clock output to the clock input includes electrically connecting a conductive via to a conductive bond pad.

In some aspects, the techniques described herein relate to a method, wherein electrically connecting the conductive via to the conductive bond pad includes electrically connecting a conductive via in the first die to a conductive bond pad in the second die.

In some aspects, the techniques described herein relate to a method, wherein forming the second die further includes forming a local clock source in the second die for testing of the second die separate from the first die.

In some aspects, the techniques described herein relate to a method, wherein forming the local clock source includes forming a programmable driver connected to an output of the local clock source.

In some aspects, the techniques described herein relate to a method, wherein: forming the first die to include the first load includes forming the first die to include a first flip-flop array; and forming the second die to include the second load includes forming the second die to include a second flip-flop array.

In some aspects, the techniques described herein relate to a method, wherein forming the first die to include a clock source includes forming the first die to include at least one of: a phase-locked loop circuit, a frequency-locked loop circuit, or a delay-locked loop circuit.

In some aspects, the techniques described herein relate to a method, wherein: forming the first die to include a clock output includes forming at least two conductive vias in the first die; and forming the second die to include a clock input includes forming at least two conductive bond pads in the second die.

FIG. 1 illustrates an example system 100 involving a computing device 102. Examples of the computing device 102 include, without limitation, memory devices, processing devices, Central Processing Units (CPUs), Graphics Processing Units (GPUs), microprocessors, microcontrollers, Field-Programmable Gate Arrays (FPGAs), Application-Specific Integrated Circuits (ASICs), Systems-on-a-Chip (SoCs), Static Random-Access Memory (SRAM) devices, Random Access Memory (RAM) devices, Read Only Memory (ROM) devices, flash memory devices, Hard Disk Drives (HDDs), Solid-State Drives (SSDs), optical disk drives, caches, routers, switches, hubs, modems, bridges, repeaters, gateways (such as Broadband Network Gateways (BNGs)), network devices, client devices, laptops, tablets, desktops, servers, cellular phones, Personal Digital Assistants (PDAs), multimedia players, embedded systems, wearable devices, gaming consoles, portions of one or more of the same, variations or combinations of one or more of the same, and/or any other suitable device.

As illustrated in FIG. 1, the computing device 102 includes and/or represents a physical processor 110 in communication with a memory device 120. In some implementations, the physical processor 110 includes a stack of a first die 112 (e.g., a first logic die, which can be considered a base die) and a second die 114 (e.g., a second logic die, which can be considered a stacked die) over and bonded to the first die 112.

As further explained below with reference to FIG. 2, the first die 112 includes a clock source and a first load (e.g., a first plurality of state storage elements, such as flip-flops) that receives a clock signal from the clock source. The first die 112 also includes a tap point along a first clock signal path between the clock source and the first load. A conductive connection extends between the tap point and a clock output of the first die 112. The second die 114 includes second clock signal path between a clock input and a second load (e.g., a second plurality of state storage elements, such as flip-flops). The clock output of the first die 112 is connected to the clock input of the second die 114. The position of the tap point along the first clock signal path is selected to substantially match a first divergence between the tap point and the first load with a second divergence between the tap point and the second load.

This arrangement of a tap point selected to substantially match the divergence between the tap point and the first load on the one hand, and between the tap point and the second load on the other hand, inhibits (e.g., reduces, minimizes, or eliminates) clock skew between the first die 112 and second die 114.

In some examples, the term "substantially" in reference to a given parameter, property, or condition, refers to a degree that one skilled in the art would understand that the given parameter, property, or condition is met with a small degree of variance, such as within acceptable manufacturing tolerances. For example, a parameter that is substantially met can be at least about 90% met, at least about 95% met, at least about 99% met, or fully met.

Examples of the physical processor 110 include, without limitation, CPUs, GPUs, microprocessors, microcontrollers, FPGAs, ASICs, SoCs, combinations or variations of one or more of the same, and/or any other type of suitable processing device. In some examples, the physical processor 110 can include and/or represent any type or form of hardware-implemented processor capable of executing computer-readable instructions stored in the memory device 120.

In some examples, the memory device 120 can include and/or represent any type or form of volatile or non-volatile storage device or computer-readable medium capable of storing data and/or computer-readable instructions. In one example, the memory device 120 includes and/or represents an SRAM device. In some examples, the memory device 120 maintains and/or stores data, including executable instructions for execution by the physical processor 110.

The term "computer-readable medium," as used herein, can generally refer to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

Many other devices or subsystems can be connected to the system 100 in FIG. 1. Conversely, all of the components and devices illustrated in FIG. 1 need not be present to practice the implementations described and/or illustrated herein. The devices and subsystems referenced above can also be interconnected in different ways from that shown in FIG. 1. The system 100 can also employ any number of software, firmware, and/or hardware configurations. For example, one or more of the example implementations disclosed herein can be encoded as a computer program (also referred to as computer software, software applications, computer-readable instructions, and/or computer control logic) on a computer-readable medium.

Figure 2:
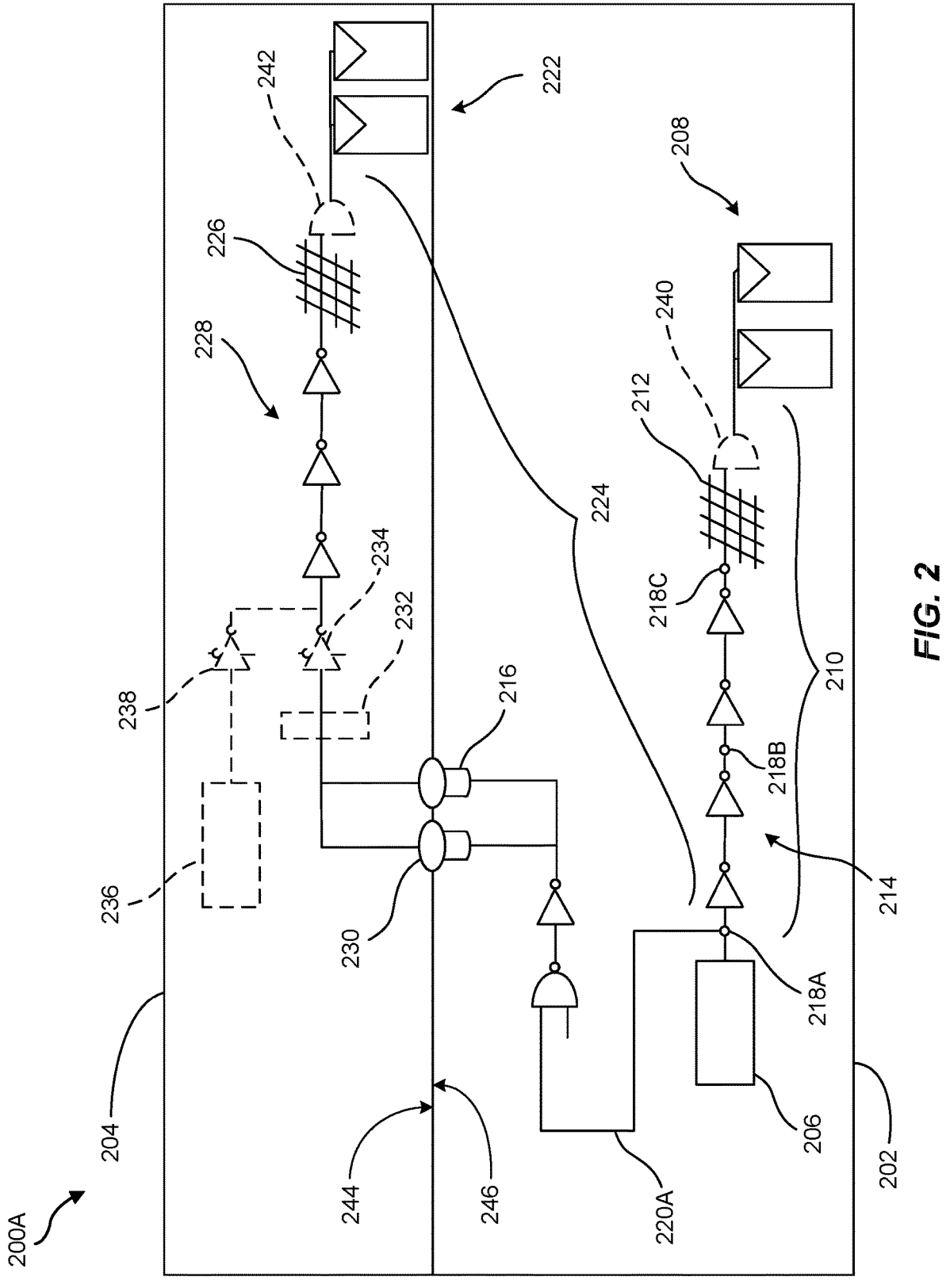
FIG. 2 is a diagram of a semiconductor device, according to at least one example implementation of the present disclosure.
Figure 3:
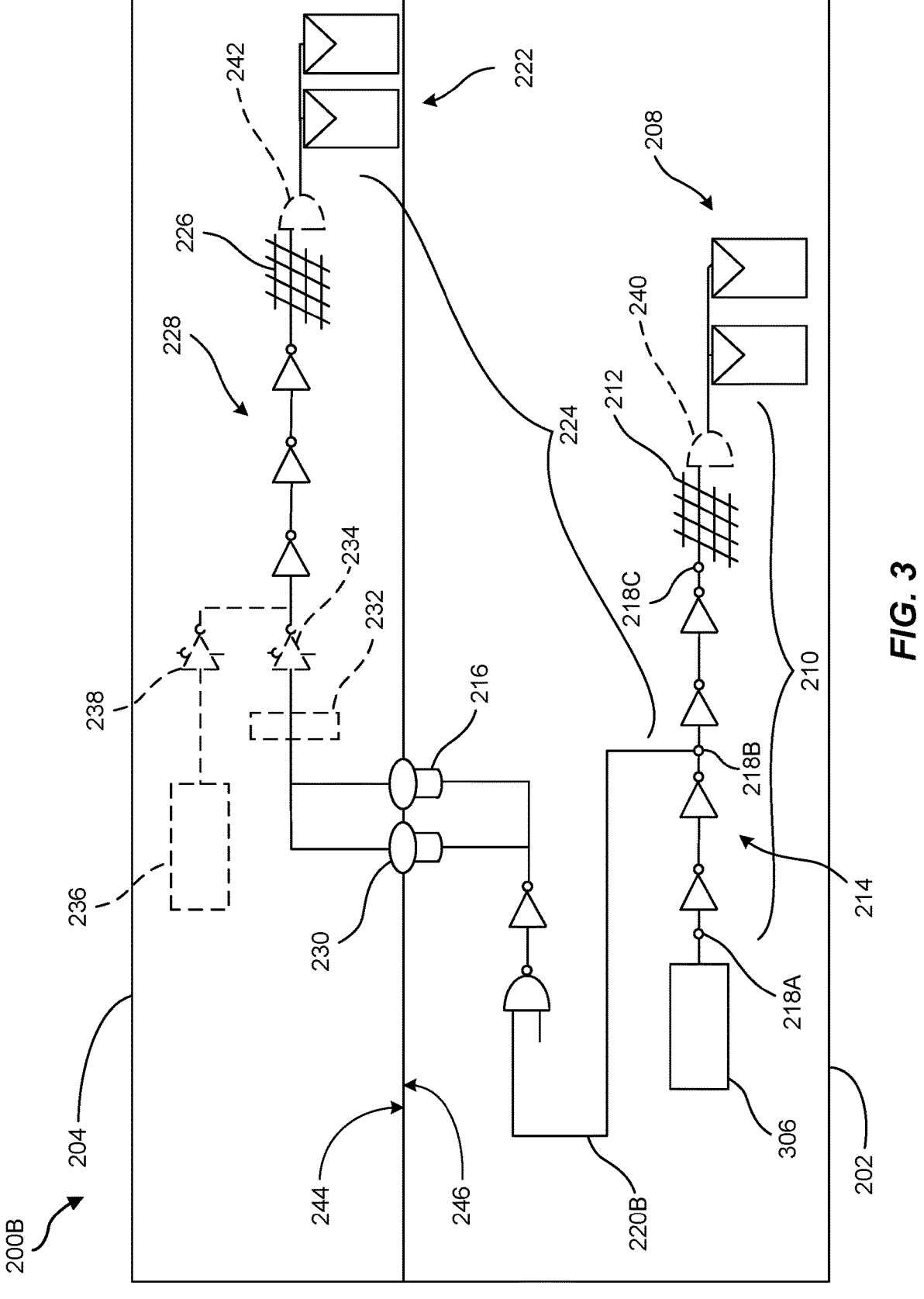
FIG. 3 is a diagram of a semiconductor device, according to at least one other example implementation of the present disclosure.
Figure 4:
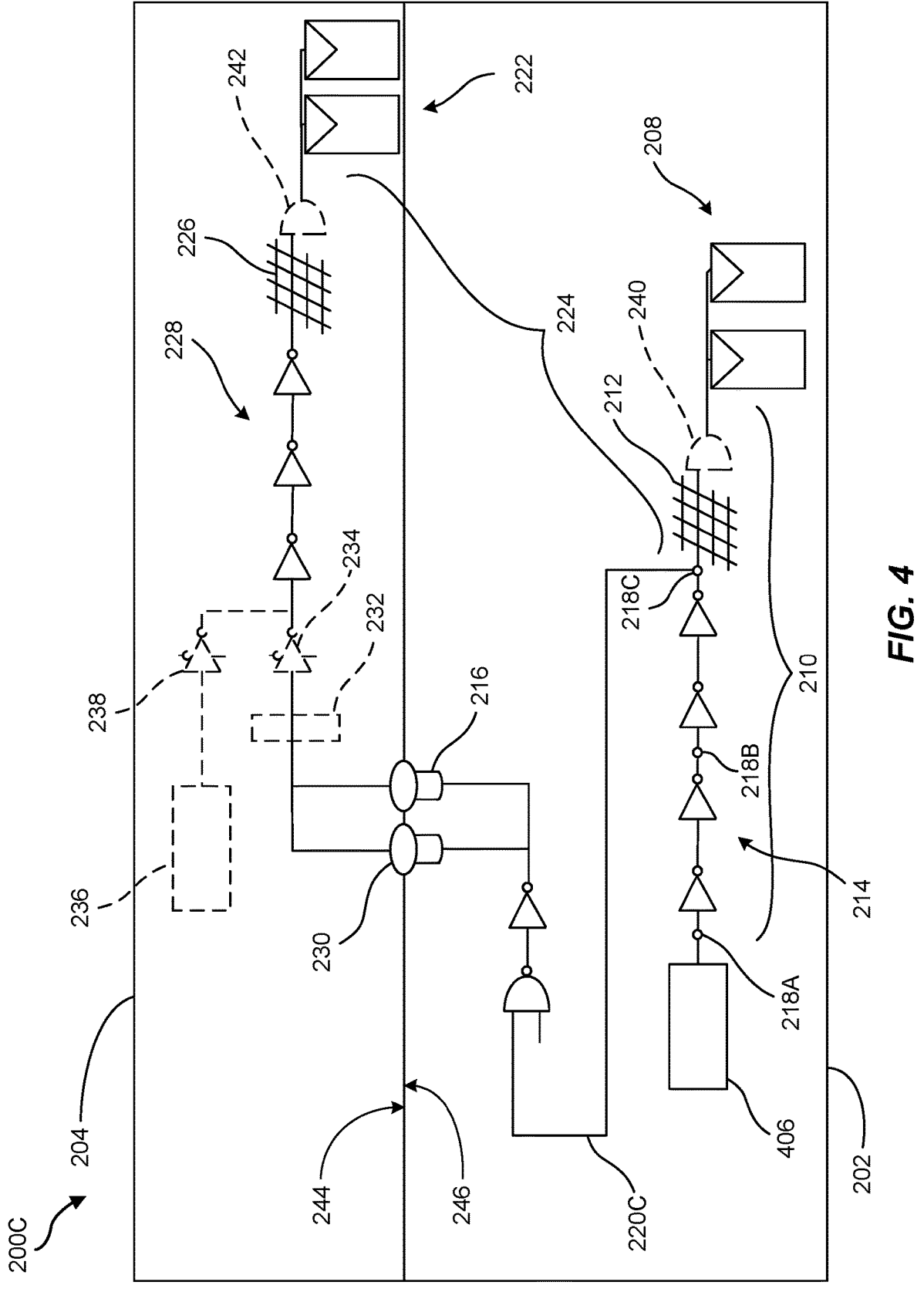
FIG. 4 is a diagram of a semiconductor device, according to at least one additional example implementation of the present disclosure.

FIG. 2 is a diagram of a semiconductor device 200A (e.g., a processor device) with a tap point in a first position, according to at least one example implementation of the present disclosure. FIG. 3 is a diagram of a semiconductor device 200B with a tap point in a second position, according to at least one other example implementation of the present disclosure. FIG. 4 is a diagram of a semiconductor device 200C with a tap point in a third position, according to at least one additional example implementation of the present disclosure. The following discussion relates to the comparative example implementations of the semiconductor device 200A of FIG. 2, the semiconductor device 200B in FIG. 3, and the semiconductor device 200C in FIG. 4. Due to similarities between these examples, the three semiconductor devices 200A, 200B, and 200C are also referred to collectively as semiconductor device 200 and similar or the same components are referred to by the same reference numerals.

The semiconductor device 200 includes a first die 202 (e.g., a first processor die, which can also be referred to as a base die) and a second die 204 (e.g., a second processor die, which can also be referred to as a stacked die) stacked over and bonded to the first die 202. The first die 202 includes a clock source 206 configured to generate a clock signal for operation of both the first die 202 and second die 204.

The first die 202 includes a first load 208 to be driven by the clock signal from the clock source 206. The first load 208 can include one or more (e.g., a first array of) transistors, state storage elements (e.g., flip-flops), resistors, capacitors, diodes, a combination thereof, etc. A first clock signal path 210 extends from the clock source 206 to the first load 208. The first clock signal path 210 can also include additional elements, such as a first clock mesh 212 that receives the clock signal from the clock source 206 and distributes the clock signal to the first load 208 (e.g., to the first array of flip-flops). In some examples, a first series of gain stages 214 (e.g., a clock tree) along the first clock signal path 210 is configured to boost, clarify, and/or distribute the clock signal from the clock source 206 prior to reaching the first clock mesh 212. In some implementations, the first clock mesh 212 can include a grid or net of metal or other conductive material.

The first series of gain stages 214 is represented in FIG. 2 as a series of inverters. The inverters of FIG. 2 represent inverters or other signal driving elements that can be present in the form of a tree of multiple inverters or other signal driving elements in series and/or in parallel.

The clock source 206 is a device or element that generates a clock signal for use by other components of the semiconductor device 200, such as for synchronizing operation of the components of the semiconductor device 200. By way of non-limiting examples, the clock source 206 can be implemented as a phase-locked loop (PLL) circuit, a frequency-locked loop (FLL) circuit, a delay-locked loop (DLL) circuit, or the like.

In some implementations, the clock source 206 generates the clock signal and transmits the clock signal to the first load 208 through the first series of gain stages 214 and the first clock mesh 212.

As noted above, the clock source 206 generates a clock signal that can be used to operate both the first die 202 and the second die 204. To this end, the first die 202 can include a clock output 216 for transmitting the clock signal to the second die 204. The clock output 216 branches from the first clock signal path 210 at one of multiple possible tap points 218A, 218B, 218C. By way of non-limiting example, a first tap point 218A can be along the first clock signal path 210 between the clock source 206 and prior to the first series of gain stages 214. A second tap point 218B can be along the first clock signal path 210 in an intermediate position along (e.g., between gain stages of) the first series of gain stages 214. A third tap point 218C can be along the first clock signal path 210 after the first series of gain stages 214 (e.g., before the first clock mesh 212).

In the example illustrated in FIG. 2, a conductive connection 220A is formed from the first tap point 218A to the clock output 216. In the example illustrated in FIG. 3, a conductive connection 220B is formed from the second tap point 218B to the clock output 216. In the example illustrated in FIG. 4, a conductive connection 220C is formed from the third tap point 218C to the clock output 216. For simplicity, the conductive connections 220A, 220B, 220C are also referred to collectively as conductive connection 220.

The second die 204 can include a second load 222. The second load 222 can include one or more (e.g., a second array of) transistors, state storage elements (e.g., flip-flops), resistors, capacitors, diodes, a combination thereof, etc. Referring to FIG. 2, a second clock signal path 224 extends from the first tap point 218A to the second load 222. Referring to FIG. 3, the second clock signal path 224 extends from the second tap point 218B to the second load 222. Referring to FIG. 4, the second clock signal path 224 extends from the third tap point 218C to the second load 222.

The second clock signal path 224 can also include additional elements, such as a second clock mesh 226 that receives the clock signal from the clock source 206 and distributes the clock signal to the second load 222 (e.g., to the second array of flip-flops). In some examples, a second series of gain stages 228 (e.g., a clock tree) along the second clock signal path 224 is configured to boost, clarify, and/or distribute the clock signal from the clock source 206 prior to reaching the second clock mesh 226. A clock input 230 of the second die 204 is electrically connected to the clock output 216 of the first die 202. Optionally, other components such as a multiplexer 232, a tristate driver 234, etc., can also be included in the second die 204 along the second clock signal path 224.

The clock output 216 and the clock input 230 are configured to electrically couple the clocking components of the first die 202 with the clocking components of the second die 204. For example, the clock output 216 can include conductive vias (e.g., through-silicon vias) that pass through at least a portion of the first die 202 and the clock input 230 can include conductive bond pads on a surface of the second die 204. In another example, the clock output 216 can include conductive bond pads on a surface of the first die 202 and the clock input 230 can include conductive vias that pass through at least a portion of the second die 204. Alternatively, both the first die 202 and second die 204 can include conductive vias that are electrically coupled to each other. In additional implementations, both the first die 202 and second die 204 can include conductive bond pads that are electrically coupled to each other.

Referring to FIG. 2, the first clock signal path 210 exhibits a first divergence (e.g., time of transmission) from the first tap point 218A to the first load 208. Referring to FIG. 3, the first clock signal path 210 exhibits a second divergence from the second tap point 218B to the first load 208 that is different from the first divergence from the first tap point 218A, such as due to fewer gain stages existing along the first clock signal path 210 after the second tap point 218B compared to after the first tap point 218A. Referring to FIG. 4, the first clock signal path 210 exhibits a third divergence from the third tap point 218C to the first load 208 that is different from both the first divergence and the second divergence, since this example has no gain stages along the first clock signal path 210 after the third tap point 218C.

The second clock signal path 224 exhibits a fourth divergence from any of the first tap point 218A, second tap point 218B, or third tap point 218C to the second load 222. The fourth divergence is substantially the same in any of these cases since there is little or no difference in electrical components between selected tap point 218A, 218B, or 218C along the second clock signal path 224 and the second load 222. The selection of which of the tap points 218A, 218B, or 218C to couple to the clock output 216 with the conductive connection 220, and ultimately to the second load 222, is based on determining which of the first divergence, second divergence, or third divergence along the first clock signal path 210 most closely matches the fourth divergence along the second clock signal path 224. By selecting the tap point 218A, 218B, or 218C that results in the lowest difference in divergence relative to the fourth divergence, clock skew can be reduced, minimized, and/or eliminated.

For example, if the fourth divergence to the second load 222 is relatively long (e.g., due to a relatively high number of components along the second clock signal path 224), the conductive connection 220 can be formed between the first tap point 218A and the clock output 216 (as illustrated in FIG. 2) since there are a relatively high number of components after the first tap point 218A to the first load 208. If the fourth divergence to the second load 222 is moderate (e.g., due to a relatively moderate number of components along the second clock signal path 224), the conductive connection 220 can be formed between the second tap point 218B and the clock output 216 (as illustrated in FIG. 3). If the fourth divergence to the second load 222 is relatively short (e.g., due to a relatively low number of components along the second clock signal path 224), the conductive connection 220 can be formed between the third tap point 218C and the clock output 216 (as illustrated in FIG. 4).

In some examples, elements of the first load 208 of the first die 202 can transmit data to and/or from elements of the second load 222 of the second die 204. Because the divergences substantially match based on selecting an appropriate position of the tap point for transmitting the clock signal to the second die 204, the transmission of the data between the first load 208 and the second load 222 can include substantially synchronized operations (e.g., setup operations and hold operations).

In some implementations, the second die 204 optionally includes a local clock source 236. The local clock source 236 generates a test clock signal for testing the second die 204 separate from the first die 202, such as prior to the second die 204 being bonded to the first die 202. For example, the second die 204 can be tested for operability at a wafer level, prior to the wafer being diced and/or stacked over the first die 202, using the local clock source 236. Testing at the wafer level enables cost reduction in manufacturing by scrapping only the single second die 204 if it is not functional to a given specification, rather than scrapping the entire semiconductor device 200 with both the first die 202 and second die 204 if only the second die 204 fails.

As illustrated in the examples of FIGS. 2-4, the optional local clock source 236, if present, can be connected to the second clock mesh 226 through a programmable driver 238 (e.g., a tristate driver). The programmable driver 238, when activated, allows the local clock signal to pass to the second clock mesh 226 and ultimately to the second load 222 for testing, but blocks use of the local clock source 236 during normal operation of the second die 204 (e.g., during operation of the second die 204 together with the first die 202 in the semiconductor device 200). Blocking use of the local clock source 236 during normal operation of the second die 204 saves power and inhibits (e.g., reduces, minimizes, or eliminates) clock skew between the first die 202 and second die 204 that might otherwise exist if the local clock source 236 and the clock source 206 were used simultaneously.

In some examples, optionally, the first die 202 includes at least one first level of gating 240 between the first clock mesh 212 and the first load 208. Likewise, the second die 204 includes at least one second level of gating 242 between the second clock mesh 226 and the second load 222. The first and second levels of gating 240, 242 are used to switch off circuits (e.g., portions of the first and second loads 208, 222, buses, bridges, controllers, etc.), such as for reducing a power consumption of the first die 202 and/or second die 204.

The first die 202 and the second die 204 can be bonded to each other along major surfaces (e.g., large, substantially flat surfaces) thereof. For example, as illustrated in FIGS. 2-4, a first major surface 244 of the first die 202 can be secured to a second major surface 246 of the second die 204 to form an interface between the first major surface 244 and the second major surface 246. The clock output 216 and the clock input 230 can be electrically connected to each other at and across this interface.

FIG. 5 is a flow diagram illustrating a method 500 of fabricating a semiconductor device, according to one or more implementations of the present disclosure. At operation 502, a first die is formed to include a clock source, a clock output, a first load, and a first tap point and a second tap point between the clock source and the first load. A first clock signal path exhibits a first divergence from the first tap point to the first load and a second divergence from the second tap point to the first load. Operation 502 can be performed in a variety of ways. For example, at least one gain stage can present between the first tap point and the second tap point, which can account for a difference between the first divergence and the second divergence. In some implementations, the first load can be formed to include a first flip-flop array. In some examples, the clock source can include at least one of a phase-locked loop (PLL) circuit, a frequency-locked loop (FLL) circuit, or a delay-locked loop (DLL) circuit. The clock output can be formed to include at least two conductive vias and/or conductive bond pads.

At operation 504, a second die is formed to include a clock input and a second load. A second clock signal path from the first tap point to the second load and from the second tap point to the second load exhibits a third divergence. Operation 504 can be performed in a variety of ways. For example, clock circuit components, such as gain stages, can be formed between the clock input and the second load. In some implementations, the second load can be formed to include a second flip-flop array. The clock input can be formed to include at least two conductive vias and/or conductive bond pads in a position to be electrically connected to the clock output of the first die.

At operation 506, based on whether the first divergence or the second divergence is closer to the third divergence, a conductive connection in the first die is formed between the clock output and either the first tap point or the second tap point. Operation 506 can be performed in a variety of ways. For example, a metallic trace or other conductive trace can be formed to connect to the first clock signal path prior to, between, or after gain stages or other clocking components along the first clock signal path.

At operation 508, the second die is secured to the first die, and the clock output is electrically connected to the clock input. Operation 508 can be performed in a variety of ways. For example, electrically connecting the clock output to the clock input can include electrically connecting a conductive via (e.g., in either the first die or the second die) to a conductive bond pad (e.g., in either the second die or the first die). In additional implementations, two conductive vias can be connected to each other or two conductive bond pads can be connected to each other.

In some implementations of the method 500, additional operations can be performed. For example, forming the second die can also include forming a local clock source in the second die for testing of the second die separate from the first die (e.g., at a wafer level, such as before securing the second die to the first die). A tristate drive can be formed after the local clock source to enable activating and/or deactivating the local clock source such that the local clock source can be activated when used for testing and deactivated when the clock source of the first die is to be used to drive the second die, such as during normal operation.

FIG. 6 is a flow diagram illustrating a method 600 of fabricating a semiconductor device, according to one or more additional implementations of the present disclosure. At operation 602, a first die is secured to a second die. The first die includes a first clock signal path from a clock source to a first load and passing through a tap point electrically connected to a clock output. The second die includes a second clock signal path from a clock input to a second load. Operation 602 can be performed in a variety of ways. For example, securing the first die to the second die can include securing a first major surface of the first die to a second major surface of the second die. The first clock signal path can include at least a first gain stage and a second gain stage between the clock source and the first load, and the tap point can be before the first and second gain stages, between the first gain stage and the second gain stage, or after the first and second gain stages. The second clock signal path can include one or more gain stages between the clock input and the second load.

At operation 604, the clock input of the second die is electrically connected to the clock input of the first die. A first divergence from the tap point to the first load is substantially the same as a second divergence from the tap point through the clock input and the clock output to the second load. Operation 604 can be performed in a variety of ways. For example, at least one conductive bond pad (e.g., in the first die or in the second die) can be electrically connected to at least one conductive via (e.g., in the second die or in the first die). Alternatively, two conductive bond pads or two conductive vias can be electrically connected to each other.

In some implementations of the method 600, additional operations can be performed. For example, the position of the tap point along the first clock signal path can be selected to substantially match the first divergence with the second divergence. A conductive connection can be formed in the first die from the tap point to the clock output to electrically connect the tap point to the clock output. Operation of the second load of the second die can be driven with a clock signal from the clock source of the first die.

Accordingly, the present disclosure includes methods and devices including stacked dies that can result in reduced or eliminated clock skew. For example, a tap point for transmitting a clock signal from a first die to a second die may be selected to substantially match a first divergence from the tap point to a first load of the first die with a second divergence from the tap point to a second load of the second die. By reducing or eliminating the clock skew in this manner, operation of the stacked semiconductor dies can be improved and/or simplified.

While the foregoing disclosure sets forth various implementations using specific block diagrams, flowcharts, and examples, each block diagram component, flowchart step, operation, and/or component described and/or illustrated herein can be implemented, individually and/or collectively, using a wide range of hardware, software, or firmware (or any combination thereof) configurations. In addition, any disclosure of components contained within other components should be considered example in nature since many other architectures can be implemented to achieve the same functionality.

The process parameters and sequence of steps described and/or illustrated herein are given by way of example only and can be varied as desired. For example, while the steps illustrated and/or described herein can be shown or discussed in a particular order, these steps do not necessarily need to be performed in the order illustrated or discussed. The various example methods described and/or illustrated herein can also omit one or more of the steps described or illustrated herein or include additional steps in addition to those disclosed.

While various implementations have been described and/or illustrated herein in the context of fully functional computing systems, one or more of these example implementations can be distributed as a program product in a variety of forms, regardless of the particular type of computer-readable media used to actually carry out the distribution. The implementations disclosed herein can also be implemented using modules that perform certain tasks. These modules can include script, batch, or other executable files that can be stored on a computer-readable storage medium or in a computing system. In some implementations, these modules can configure a computing system to perform one or more of the example implementations disclosed herein.

The preceding description has been provided to enable others skilled in the art to best utilize various aspects of the example implementations disclosed herein. This example description is not intended to be exhaustive or to be limited to any precise form disclosed. Many modifications and variations are possible without departing from the spirit and scope of the present disclosure. The implementations disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A semiconductor device, comprising:
   a first die including a first clock signal path from a clock source to a first load and passing through a tap point, wherein the tap point is electrically connected to a clock output; and
   a second die secured to the first die, the second die including a second clock signal path from a clock input to a second load, the clock input electrically connected to the clock output,
   wherein: the tap point to the first clock signal path is positioned such that a travel time of a clock signal on the first clock signal path is substantially the same as a travel time of the clock signal on the second clock signal path.
2. The semiconductor device of claim 1, wherein the first clock signal path includes one or more first gain stages and the second clock signal path includes one or more second gain stages.

3. The semiconductor device of claim 2, wherein the tap point is between the one or more first gain stages and the one or more second gain stages.

4. The semiconductor device of claim 1, wherein the second die is stacked over the first die such that a first major surface of the first die is secured to a second major surface of the second die.

5. The semiconductor device of claim 1, wherein the clock input is electrically connected to the clock output through at least one of a conductive via and at least one of a conductive bond pad.

6. The semiconductor device of claim 1, wherein:
the first load comprises a first flip-flop array; and
the second load comprises a second flip-flop array.

7. The semiconductor device of claim 1, wherein the second die further comprises a local clock source for testing of the second die separate from the first die.

8. A semiconductor device, comprising:
a first die including a clock source, a clock output, a first load, and a first tap point and a second tap point between the clock source and the first load, wherein a first clock signal path exhibits a first divergence from the first tap point to the first load and a second divergence from the second tap point to the first load;
a second die including a clock input and a second load, wherein a second clock signal path from the first tap point to the second load and from the second tap point to the second load exhibits a third divergence; and
a conductive connection in the first die between the clock output and either the first tap point or the second tap point based on whether the first divergence or the second divergence is closer to the third divergence,
wherein the second die is secured to the first die and the clock output is electrically connected to the clock input.

9. The semiconductor device of claim 8, wherein the first die includes at least one gain stage between the first tap point and the second tap point.

10. The semiconductor device of claim 8, wherein the clock output is electrically connected to the clock input via to a conductive bond pad.

11. The semiconductor device of claim 10, wherein:
the first die comprises a conductive via;
the second die comprises the conductive bond pad; and
the conductive via of the first die is electrically connected to the conductive bond pad of the second die.

12. The semiconductor device of claim 8, wherein the second die further comprises a local clock source for testing of the second die separate from the first die.

13. The semiconductor device of claim 12, wherein the local clock source comprises a programmable driver connected to an output of the local clock source.

14. The semiconductor device of claim 8, wherein:
the first load of the first die includes a first flip-flop array; and
the second load of the second die includes a second flip-flop array.

15. The semiconductor device of claim 8, wherein the clock source of the first die comprises at least one of: a phase-locked loop circuit, a frequency-locked loop circuit, or a delay-locked loop circuit.

16. The semiconductor device of claim 8, wherein:
the clock output of the first die comprises at least two conductive vias in the first die; and
the clock input of the second die comprises at least two conductive bond pads in the second die.

17. A method of fabricating a semiconductor device, the method comprising:
securing a first die, the first die including a first clock signal path from a clock source to a first load and passing through a tap point, wherein the tap point is electrically connected to a clock output of the first die, to a second die, the second die including second clock signal path from a clock input to a second load; and
electrically connecting the clock input of the second die to the clock output of the first die, wherein the tap point to the first clock signal path is positioned such that a travel time of a clock signal on the first clock signal path is substantially the same as a travel time of the clock signal on the second clock signal path.

18. The method of claim 17, wherein securing the first die to the second die comprises securing a first major surface of the first die to a second major surface of the second die.

19. The method of claim 17, further comprising selecting a position of the tap point along the first clock signal path to substantially match a first divergence from the tap point to the first load with a second divergence from the tap point to the second load.

20. The method of claim 19, further comprising forming a conductive connection in the first die from the tap point to the clock output to electrically connect the tap point to the clock output.

* * * * *